United States Patent [19]

Brown et al.

[11] Patent Number: 4,503,090
[45] Date of Patent: Mar. 5, 1985

[54] THICK FILM RESISTOR CIRCUITS

[75] Inventors: John F. Brown, Emmaus; Robert M. Stanton, Allentown, both of Pa.

[73] Assignee: AT&T Bell Laboratories, Murray Hill, N.J.

[21] Appl. No.: 468,955

[22] Filed: Feb. 23, 1983

[51] Int. Cl.³ .............................................. H01C 17/06
[52] U.S. Cl. .................................... 427/96; 427/102; 427/103; 427/123; 427/125; 427/126.2; 427/126.3; 427/126.4; 427/126.5; 427/343; 427/376.6; 427/376.7; 427/380; 427/404; 427/419.2; 252/512; 252/514; 252/518

[58] Field of Search ................ 427/101, 96, 102, 103, 427/123, 125, 376.6, 380, 404, 419.2, 343, 376.7, 126.2, 126.3, 126.4, 126.5; 252/512, 514, 518; 420/502

[56] References Cited

U.S. PATENT DOCUMENTS

| | | | |
|---|---|---|---|
| 3,922,236 | 11/1975 | Douglas et al. | 252/512 |
| 4,039,721 | 8/1977 | Weitze et al. | 252/512 |
| 4,072,771 | 2/1978 | Grier | 427/96 |
| 4,140,817 | 2/1979 | Brown | 427/96 |
| 4,255,291 | 3/1981 | Needes et al. | 252/512 |
| 4,316,920 | 2/1982 | Brown | 427/96 |
| 4,409,181 | 10/1983 | Coad | 420/502 |

FOREIGN PATENT DOCUMENTS 1374763  11/1974  United Kingdom ..................... 17/2

OTHER PUBLICATIONS

Loasby et al, "Enhanced Property Thick-Film Conductor Pastes", *Solid State Technology*, pp. 46-50, 72, (May 1972).

*Primary Examiner*—Richard Bueker
*Attorney, Agent, or Firm*—Lester H. Birnbaum

[57] ABSTRACT

A method of forming thick film resistor circuits whereby a non-hole metal, such as copper, requiring a reducing atmosphere is included with resistor material requiring an oxidizing atmosphere. A fritless conductor paste with a small percentage of silver is deposited and fired in air at a low temperature. Resistors are then deposited and fired in air. Subsequently, the conductor material is reduced at a sufficiently low temperature so as not to adversely affect the resistors.

9 Claims, 1 Drawing Figure

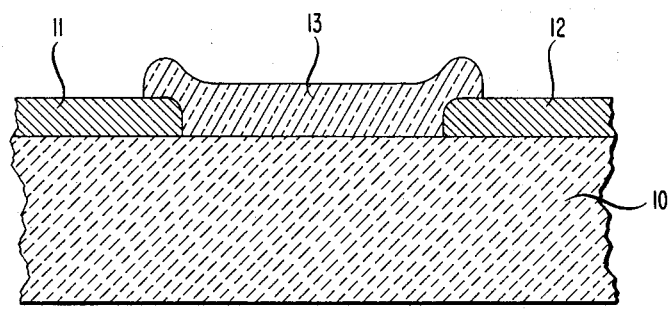

THICK FILM RESISTOR CIRCUITS

BACKGROUND OF THE INVENTION

This invention relates to thick film circuits and in particular to a method which allows non-noble metal conductors to be included with thick film resistors.

At the present time, most thick film circuits employ a conductor system based on the noble metals silver, gold, palladium and platinum, alone or in combination, and ruthenium-based resistor material. Precious metal pastes, though providing high conductivity, are fairly costly. In addition, silver-based pastes can result in migration of silver across the substrate to cause short circuits. Furthermore, poor solderability often results noble-metal systems are used.

In view of the above problems, workers in the art have proposed alternatives to the noble-metal system and in particular the use of copper-based conductors. For example, copper pastes which are deposited and fired in a nitrogen atmosphere have been developed (see, e.g., U.S. Pat. No. 4,072,771 issued to Grier). However, such pastes are incompatible with ruthenium-based resistor materials which require firing in an oxidizing atmosphere.

Other proposals have been made which permit a copper paste conductor requiring a reducing atmosphere to be fabricated along with resistors requiring an oxidizing atmosphere. For example, we previously suggested depositing a fritless copper paste, firing at a high temperature, then reducing the material and re-oxidizing to form a low density copper oxide. The resistors were then deposited and fired in air, followed by reducing the copper oxide at a sufficiently low temperature so as not to degrade the resistors (see U.S. Pat. No. 4,140,817, issued to Brown et al). Although effective, the process required a high initial firing in a special furnace and extra process steps. Therefore, we later proposed using a fritted copper paste which could be fired at a low temperature. After the resistors were formed, the material could be reduced at a low temperature which did not significantly affect the resistors (see U.S. Pat. No. 4,316,920 issued to Brown et al). While such a process was satisfactory, a need still existed for improved conductivity, adhesion and solderability of the conductor material.

It is therefore a primary object of the invention to provide a method of fabricating a thick film circuit which includes a non-noble metal conductor requiring a reducing atmosphere and a resistor requiring an oxidizing atmosphere in a manner which results in improved conductivity, adhesion and solderability of the conductor.

SUMMARY OF THE INVENTION

This and other objects are achieved in accordance with the invention, which is a method for fabricating a thick film resistor circuit on a substrate. Deposited on the substrate is a fritless paste comprising a metal component, where the metal component comprises primarily copper and further includes 1–25 percent of silver. The structure is then heated at a temperature of less than 1100 degrees C in an oxidizing atmosphere to bond the metal component to the substrate. A resistor material is then formed on the substrate and portions of the metal, and the resulting structure is heated in an oxidizing atmosphere to establish a desired sheet resistance for the resistor material. The structure is then heated in a reducing atmosphere to establish a desired sheet resistance for the metal without significantly affecting the resistor material.

BRIEF DESCRIPTION OF THE DRAWING

These and other features of the invention are delineated in detail in the following description. In the drawing, the FIGURE is a cross-sectional view of a portion of a thick film circuit fabricated in accordance with one embodiment of the invention. It will be appreciated that the FIGURE is not necessarily drawn to scale.

DETAILED DESCRIPTION OF THE INVENTION

The FIGURE illustrates a portion of a thick film circuit. It will be appreciated that a typical circuit includes many conductive and resistive elements along with other components.

The circuit is fabricated on an insulating substrate, 10, which is typically alumina. In order to form the conductive pattern (11, 12), a suitable thick film paste was first prepared.

In accordance with a feature of the invention, the paste, which is fritless, includes a metal component which comprises primarily copper and includes a small amount of silver. The copper and silver could be present as an alloy, as a silver-coated copper particle, or as a mixture, although an alloy is preferred. The Cu/Ag alloy can be formed by sintering at a temperature just below the melting point of the alloy or by jet atomization in the liquid state. It was discovered that the addition of silver to the coppper paste enhances the bonding mechanism with the substrate and therefore permits firing at a low temperature after deposition without the need for frits in the paste. The conductivity, adhesion and solderability of a conductor formed from a fritless paste has been found to be generally superior to one formed from a fritted paste when subjected to oxidation and then reduction reactions.

It is recommended that the Cu/Ag combination contain as little silver as possible to keep migration of silver to other portions of the circuit at a low level. The combination should be less than 25 percent silver and preferably less than 10 percent. A minimum percentage of silver is approximately 1 percent.

The metal component of the paste may also include a small amount of aluminum which apparently helps prevent the oxidation of copper during powder processing, acts as a protective coat for the Cu/Ag particles, contributes to the formation of the interface with certain alumina surfaces upon firing, and improves the resistance of the fired conductor to the leaching action of molten tin in a subsequent soldering process. A preferred range for the aluminum is apparently 0.1–1.0 percent.

The paste also included an organic vehicle to permit screen printing. Typically, the vehicle includes a binder and at least one solvent. In this example, the vehicle was ethyl cellulose dissolved in a bindary solvent of alpha terpineol and butyl carbitol acetate. The binder preferably comprises 3–20 percent of the vehicle and either of the two solvents can be varied from 0–100 percent of the solvent for the vehicle.

In a particular example, a 10,000 gm batch of the alloy was prepared by taking 9100 gms of copper, 800 gms of silver, and 100 gms of aluminum and alloying the two by jet atomization of the liquid metal using argon gas. Meanwhile, a 10 percent solution of the vehicle was formed by mixing 10 gms of the binder and 45 gms of each of the solvents. A portion of the metal powder particles having a size of 25 μm or less was mixed with the organic vehicle to form a thick film paste. In this example, the paste was approximately 85 percent by weight of the metal and 15 percent by weight of the vehicle (85 gms of powder and 15 gms of vehicle). However, a useful range for the metal is 10–90 percent of the paste depending on particular needs.

The conductor paste was deposited on the substrate, 10, to form the desired conductor pattern (11, 12) by means of standard screen-printing. The thickness of the paste after drying at 125 degrees C for approximately 10 minutes was approximately 0.001 in., although a thickness in the range 0.0005–0.002 in. would be useful.

In order to bond the metal component to the substrate, the deposited paste was fired in air. In this example, the peak firing temperature was 1,000 degrees C for 8–10 minutes in a standard belt kiln. Total heating time was 1 hr. where the temperature was first increased at a rate of 60 degrees C per minute and then decreased at a rate of 60 degrees C per minute. One of the significant features of the invention is the fact that the metal is bonded at such a low temperature, which permits reduction at a low temperature later in the processing. The maximum firing temperature useful for such a process appears to be 1100 degrees C. A preferred minimum temperature is approximately 950 degrees C.

As a result of firing, essentially all of the organic vehicle is evaporated, and what is left is a layer comprising mainly copper oxide and a thin glue layer (approximately 0.05 mils thick) between the copper and substrate which consists essentially of copper aluminates and aluminites ($CuAl_2O_4$, $CuAlO_2$), silver aluminates ($AgAlO_2$), and $CuO$. The presence of silver or silver oxide could not be detected by X-ray analyses, and so if they are present, it is in an amount of less than 5 percent.

After the desired conductor pattern is formed, a resistor material (13) was then deposited on selected portions of the substrate and conductors. In this particular example, the resistor was formed from a standard paste comprising a bismuth ruthenate and lead boro-silicate glass sold by DuPont under the designation "Birox". However, the invention could be used with any resistor material firable in an oxidizing atmosphere, although it is particularly beneficial with any ruthenium-based resistor material.

The resistor paste was dried by heating the structure at 125 degrees C for 10 minutes, which times and temperatures are not critical. The thickness of the resistor after drying was approximately 0.8 mils, and usually ranges from 0.7–0.9 mils.

Next, the desired sheet resistance of the resistors was achieved by firing the structure in air at temperatures and times which will vary according to the particular material and the desired sheet resistance. In this example, the firing was done at a peak temperature of 850 degrees C for 10 minutes to achieve a sheet resistance of approximately 1,000 ohms per square. The total firing cycle was 60 minutes, with the temperature increasing at a rate of 35 deg./min. and then decreasing at a rate of 45 deg./min.

Following the oxidation of the resistors, the desired sheet resistance of the conductors (11, 12) was established by heating the structure in a reducing atmosphere. In this particular example, the structure was heated in a belt kiln in an atmosphere of 10 percent $H_2$ and 90 percent $N_2$ at a peak temperature of 400 degrees C for 30 minutes. Total heating time was 90 minutes where the temperature rose at a rate of 20 degrees C per minute and decreased at a rate of 20 degrees C per minute. As mentioned previously, an important advantage of the invention is the fact that the initial firing of the paste in air at a low temperature permits the reduction at a sufficiently low temperature so that the resistors are not adversely affected. In general, a useful heating range is 250–400 degrees C peak temperature for 15–60 minutes. The particular sheet resistance achieved here for the conductors was 0.0035 ohms per square, and a sheet resistance of less than 0.005 ohms per square is preferred. Although an $H_2/N_2$ atmosphere was used, any reducing atmosphere could probably be employed.

It should be understood that in the context of the present application, the term "metal component" is intended to include the oxides of the metals as well as the metals themselves. Further, other organic vehicles can be used as long as they provide the desired rheological properties for application of the paste. The vehicle should be thixotropic, have a viscosity for good screen-printing and be removable during firing at a low temperature and rate to avoid cracks and voids.

Various additional modifications will become apparent to those skilled in the art. All such variations which basically rely on the teachings through which the invention has advanced the art are properly considered within the spirit and scope of the invention.

What is claimed is:

1. A method of fabricating a thick film resistor circuit on a substrate comprising the steps of:

depositing on the substrate a fritless paste comprising a metal component where the metal component comprises primarily copper and further includes 1–25 percent by weight of silver;

heating the structure at a temperature of less than 1100 degrees C in an oxidizing atmosphere to bond the metal component to said substrate;

forming a resistor material on said substrate and on portions of said metal;

heating the resulting structure in an oxidizing atmosphere to establish a desired sheet resistance for the resistor material; and heating the structure in a reducing atmosphere to establish a desired sheet resistance for the metal without significantly affecting the resistor material.

2. The method according to claim 1 wherein the metal component further comprises aluminum in an amount of 0.1–1.0 percent.

3. The method according to claim 1 wherein the amount of silver is 1–10 percent by weight of the metal component.

4. The method according to claim 1 wherein the resistor material comprises ruthenium-based components.

5. The method according to claim 1 wherein the final sheet resistance for the metal is less than 0.005 ohms per square.

6. The method according to claim 1 wherein the desired sheet resistance of the metal is obtained by heating at a peak temperature of 250–400 degrees C for 15–60 minutes.

7. The method according to claim 1 wherein the substrate comprises alumina.

8. The method according to claim 1 wherein the paste further comprises an organic vehicle comprising a binder and at least one solvent.

9. A method of fabricating a thick film resistor circuit on an alumina substrate comprising the steps of:
   depositing on the substrate a fritless paste comprising a metal component where the metal component comprises primarily copper and further includes 1–10 percent by weight of silver;
   heating the structure at a temperature of less than 1100 degrees C in air to bond the metal component to the substrate;
   forming a ruthenium-based resistor material on said substrate and portions of said metal;
   heating the resulting structure in air to establish a desired sheet resistance for the resistor material; and
   heating the structure in a reducing atmosphere at a peak temperature of 250–400 degrees C for 15–60 minutes to establish a sheet resistance for the metal of less than 0.005 ohms per square without significantly affecting the resistor material.

* * * * *